United States Patent
Jeong et al.

(10) Patent No.: US 7,307,342 B2
(45) Date of Patent: Dec. 11, 2007

(54) INTERCONNECTION STRUCTURE OF INTEGRATED CIRCUIT CHIP

(75) Inventors: Se-Young Jeong, Seoul (KR);
Sung-Min Sim, Gyeonggi-do (KR);
Soon-Bum Kim, Gyeonggi-do (KR);
In-Young Lee, Gyeonggi-do (KR);
Young-Hee Song, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 45 days.

(21) Appl. No.: 11/195,361

(22) Filed: Aug. 1, 2005

(65) Prior Publication Data

US 2006/0060970 A1 Mar. 23, 2006

(30) Foreign Application Priority Data

Jul. 30, 2004 (KR) .................. 10-2004-0060188

(51) Int. Cl.
*H01L 23/48* (2006.01)
*H01L 23/52* (2006.01)
*H01L 29/40* (2006.01)

(52) U.S. Cl. ...................... 257/750; 257/737

(58) Field of Classification Search ............ 257/737, 257/750

See application file for complete search history.

(56) References Cited

U.S. PATENT DOCUMENTS 6,413,863 B1  7/2002  Liu et al.
7,005,752 B2 * 2/2006 Bojkov et al. ............ 257/786
2003/0116845 A1 * 6/2003 Bojkov et al. ............ 257/738
2003/0205628 A1 * 11/2003 Aizawa et al. ............ 239/590
2004/0067604 A1 * 4/2004 Ouellet et al. ............ 438/108

FOREIGN PATENT DOCUMENTS

JP   2000-208553   7/2000
KR   1999-0055460  7/1999
WO   WO 00/72380 A1  11/2000

OTHER PUBLICATIONS

English language abstract of the Korean Publication No. 1999-0055460.
English language abstract of the Japanese Publication No. 2000-208553.

* cited by examiner

Primary Examiner—Jerome Jackson
Assistant Examiner—Anthony Ho
(74) Attorney, Agent, or Firm—Marger Johnson & McCollom, P.C.

(57) ABSTRACT

An interconnection structure includes an integrated circuit (IC) chip having internal circuitry and a terminal to electrically connect the internal circuitry to an external circuit, a passivation layer disposed on a top surface of the IC chip, the passivation layer configured to protect the internal circuitry and to expose the terminal, an input/output (I/O) pad, where the I/O pad includes a first portion in contact with the terminal and a second portion that extends over the passivation layer, and an electroless plating layer disposed on the I/O pad.

19 Claims, 6 Drawing Sheets

US 7,307,342 B2

INTERCONNECTION STRUCTURE OF INTEGRATED CIRCUIT CHIP

CROSS REFERENCE TO RELATED APPLICATIONS

This application claims priority from Korean Patent Application No. 2004-60188, filed on Jul. 30, 2004, the content of which is hereby incorporated by reference in its entirety for all purposes.

BACKGROUND

1. Technical Field

This disclosure relates generally to an interconnection structure of an integrated circuit (IC) chip and, more particularly, to a structure associated with an input/output (I/O) pad having increased contact area with an electroless nickel plating layer.

2. Description of the Related Art

Flip chip bonding technology and wafer level packaging technology may employ metal bumps which are distributed over a surface of the IC chip. Such distribution of bump locations may provide several advantages of smaller package size, higher mounting density, improved electrical properties, etc. in comparison with conventional interconnection and packaging technologies.

Typically, the metal bumps are formed on respective I/O pads exposed at the chip surface. The I/O pads are chip terminals that allow signal/power access to and from chip internal circuitry. While the metal bumps may be made of mainly solder, the I/O pads may be made of aluminum or copper. Connections between the metal bump and the I/O pad may require under bump metal (UBM) layers. The UBM layers may act as an adhesive layer, a diffusion barrier, a plating base, and a solder wetting layer.

As well known in the art, the UBM layers may be composed of one or more layers and are formed through a complicated process. To form the UBM layers, several metals are deposited in sequence by sputtering, for example, which are then covered with photoresist material. The photoresist material is selectively removed by exposure and development, thus producing a desired photoresist pattern. Then bump metal is deposited using electroplating, for example, on the pre-deposited UBM metals through the photoresist pattern. After the photoresist pattern is completely removed, the UBM metals are etched using the bump metal as an etch mask. These complicated processes may incur increases in time and cost.

Electroless plating techniques, or electroplating, can uniformly and simply form a plating layer by dipping an object to be plated in a bath containing an appropriate chemical solution. Through an electrolysis process, products from the chemical solution are selectively deposited on the UBM layers on the I/O pads, thus eliminating the need for photoresist material, related processes, and etching of the UBM layers.

FIG. 1 is a sectional diagram illustrating a conventional interconnection structure of an IC chip. Referring to FIG. 1, the IC chip 10 has a tungsten pad 11 disposed on an upper portion of the chip. The tungsten pad 11 is a terminal for internal chip circuitry. An I/O pad 12 is formed of aluminum or copper on the tungsten pad 11. A top surface of the IC chip 10 is covered with a passivation layer 13 and a polymer layer 14 for protecting the chip internal circuitry. The I/O pad 12 is exposed through the passivation layer 13 and the polymer layer 14.

Minute zinc particles 15 are formed on the I/O pad 12 using a zincating, or zinc immersion, technique. The zinc particles 15 may act as a plating core during electroless plating. A surface of the I/O pad 12 is coated with a nickel layer 16 through chemical reduction. A ball-shaped solder bump 17 is formed on the nickel layer 16 acting as the UBM layer.

In this conventional interconnection structure, a contact area between the I/O pad 12 and the electroless nickel plating layer 16 is relatively small. For example, the diameter of the circular-shaped nickel layer 16 is about 135 μm. However, the diameter or width of the I/O pad 12 is about 70 μm, and further, an exposed part of the I/O pad 12 is only about 50 μm in diameter. This may cause a difference between the size of the I/O pad 12 allowed at the chip level and the size of the plating layer 16 required at the package level.

Since the contact area between the I/O pad 12 and the plating layer 16 is limited to the exposed part of the I/O pad 12, metallic joints between both metal layers 12 and 16 may often be unsatisfactory. Therefore, when the metallic joints are subjected to thermally inducted stress, cracks or delaminations may occur in the metallic joints, which raises concerns regarding yield and reliability.

Embodiments of the invention address these and other disadvantages of the conventional art.

SUMMARY

Embodiments of the invention provide an interconnection structure for an integrated circuit (IC) chip in which the connections between metallic input/output (I/O) pads and metallic plating layers are strengthened.

DETAILED DESCRIPTION

Figure 1:
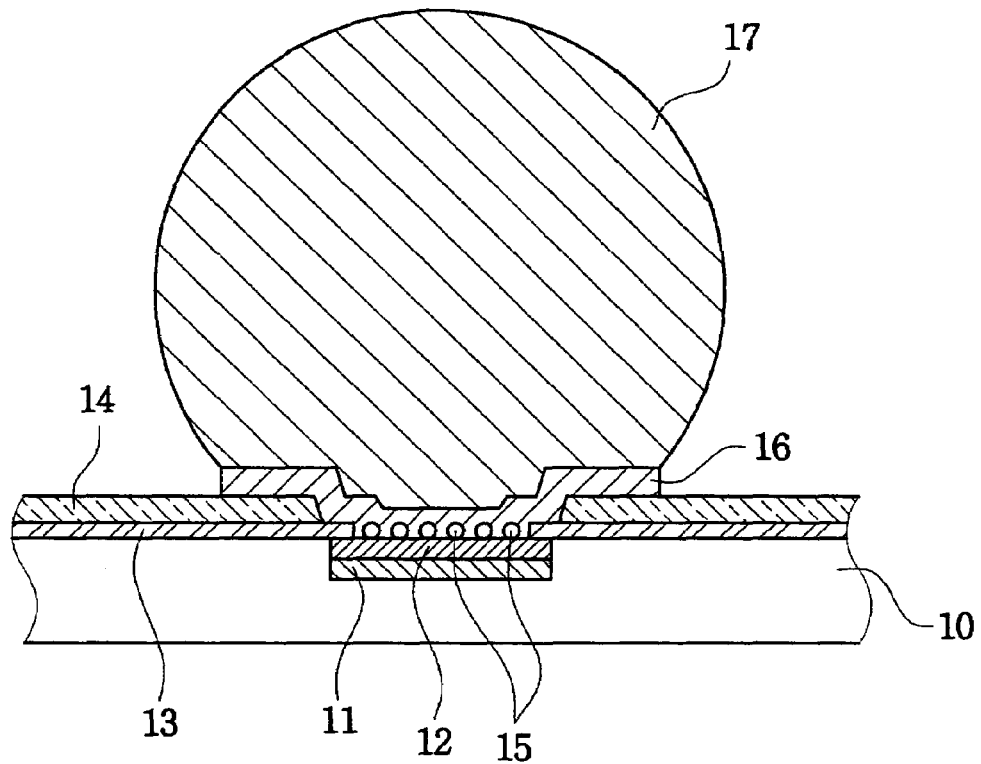
FIG. 1 is a sectional diagram illustrating a conventional interconnection structure of an IC chip.

Exemplary, non-limiting embodiments of the invention are described more fully below with reference to the accompanying drawings. This invention may, however, be embodied in many different forms and should not be construed as limited to the exemplary embodiments set forth herein. Rather, the disclosed embodiments are provided so that this disclosure will be thorough and complete, and will fully convey the teachings of the invention to those skilled in the art. As will be recognized by those of skill in the art, the teachings of this invention may be employed in varied and numerous embodiments without departing from said teachings.

To avoid unnecessarily obscuring the inventive aspects of the exemplary embodiments, well-known structures and processes may not be described or illustrated in detail. Furthermore, for simplicity and clarity of illustration, the figures are not drawn to scale. Rather, the dimensions of some of the elements are exaggerated relative to other elements. Throughout the drawings, like reference numerals are used to indicate similar parts. Furthermore, it should be recognized that the structure illustrated in the following figures, which shows only one small part of an IC chip, my be repeated over the entire IC chip and similarly, over a whole wafer.

Figure 2:
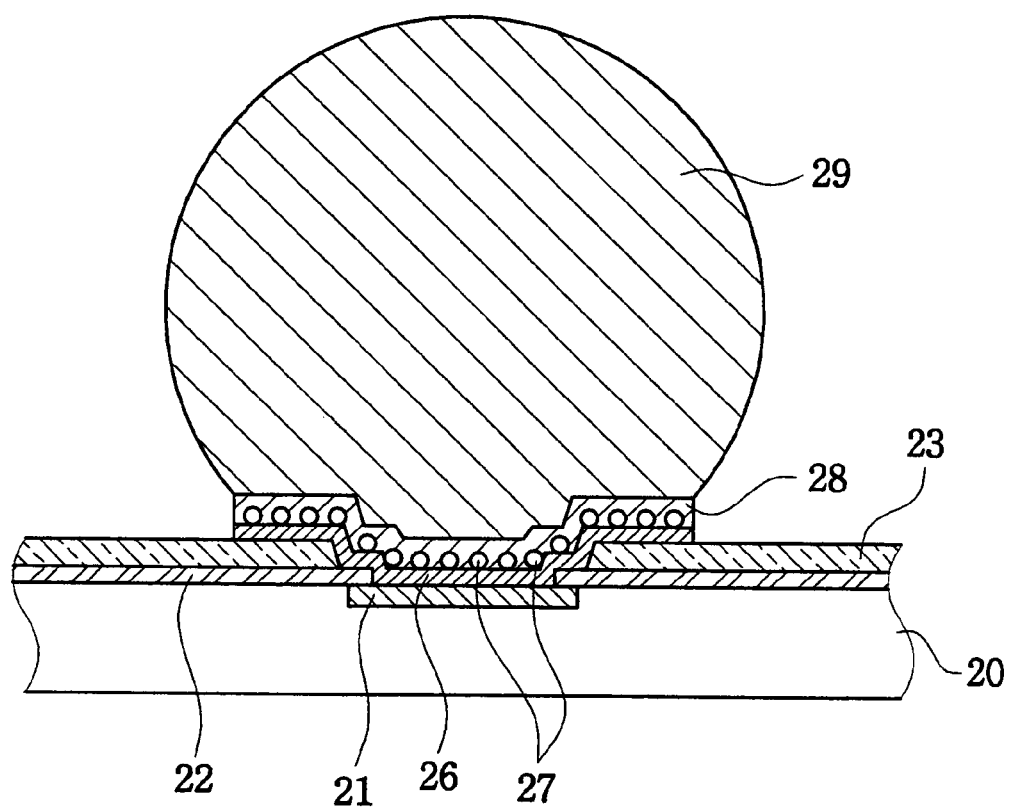
FIG. 2 is a sectional diagram illustrating an interconnection structure of an IC chip in accordance with some embodiments of the invention.

FIG. 2 is a sectional diagram illustrating an interconnection structure of an IC chip 20 in accordance with some embodiments of the invention. A tungsten pad 21 is disposed on an upper portion of the IC chip 20. The IC chip 20 has internal circuitry (not shown), and the tungsten pad 21 is provided as a terminal for internal chip circuitry. The tungsten pad 21 may be formed of some other suitable material besides tungsten. The IC chip 20 may be a memory device such as DRAM, SRAM, or flash memory, or it may be a non-memory device such as a logic device.

A top surface of the IC chip 20 is covered with a passivation layer 22. The passivation layer 22 provides protection to the chip internal circuitry and may be formed of silicon nitride or silicon oxide. A polymer layer 23 covers the passivation layer 22. The polymer layer 23 may be formed of polyimide, for example, and provides electrical isolation, protection, and stress dispersion. The tungsten pad 21 is exposed through the passivation layer 22 and the polymer layer 23.

An I/O pad 26 is disposed above the tungsten pad 21 and extends to a top surface of the polymer layer 23. That is, a central portion of the I/O pad 26 is in contact with the tungsten pad 21, and a peripheral portion of the I/O pad 26 is in contact with the polymer layer 23 around the tungsten pad 21. The I/O pad 26 may be formed of aluminum or copper. Minute zinc particles 27 are formed on the I/O pad 26 using a zinc immersion, or zincating, technique. The zinc particles 27 may act as a plating core during a subsequent electroless plating process.

In the electroless plating process, a surface of the I/O pad 26 is coated with a suitable plating layer 28 through chemical reduction. The electroless plating layer 28 may be formed of nickel and acts as the UBM layer. Phosphorus or boron may be added to the nickel, and a gold layer may be deposited on the nickel layer. A metal bump 29, such as a ball-shaped solder bump, may be formed on the electroless plating layer 28.

As discussed above, the I/O pad 26 that extends to the top surface of the polymer layer 23 may satisfy the size requirement of the package level. In comparison with the aforementioned conventional structure, an exposed part of the tungsten pad 21 may remain about 50 μm in diameter. However, the diameter of the I/O pad 26 may approximate 135 μm, which is substantially equal to that of the electroless plating layer 28. As a result, the contact area between the I/O pad 26 and the electroless plating layer 28 is increased about 7.3 times compared to the conventional structure.

FIGS. 3A to 3E are sectional diagrams illustrating a sequence of exemplary processes for forming the interconnection structure of FIG. 2.

Figure 3A:
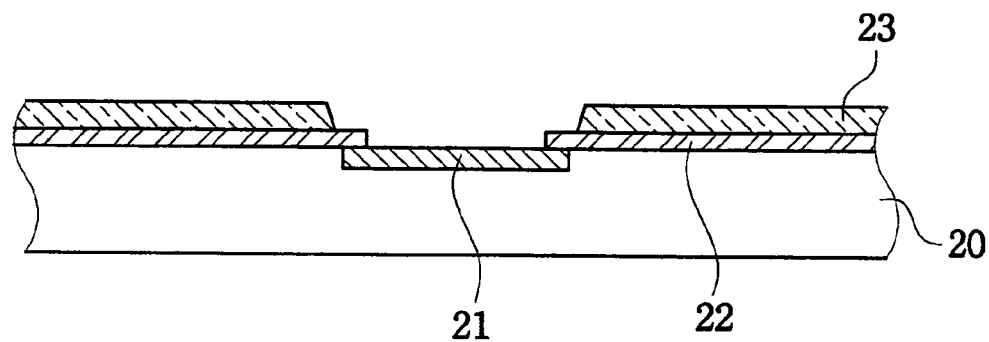
FIGS. 3A to 3E are sectional diagrams illustrating a sequence of exemplary processes for forming the interconnection structure of FIG. 2.

Referring to FIG. 3A, the tungsten pad 21 is formed on the upper portion of the IC chip 20 during a wafer fabrication process. The tungsten pad 21 is provided as a terminal of the chip internal circuitry. The passivation layer 22 and the polymer layer 23 are deposited in sequence on the top surface of the IC chip 20, providing protection, electrical isolation, and stress dispersion.

The passivation layer 22 may be formed of silicon nitride or silicon oxide, and the polymer layer 23 may be formed of polyimide, epoxy, benzo-cyclo-butene (BCB), or other suitable polymeric material. Portions of the passivation layer 22 and the polymer layer 23 are removed to selectively expose the tungsten pad 21 to the outside. Layer deposition and selective removal processes are well known in this art, and therefore a detailed description of the same is omitted. Furthermore, it will be appreciated that such processes may be performed simultaneously on the whole wafer.

Figure 3B:
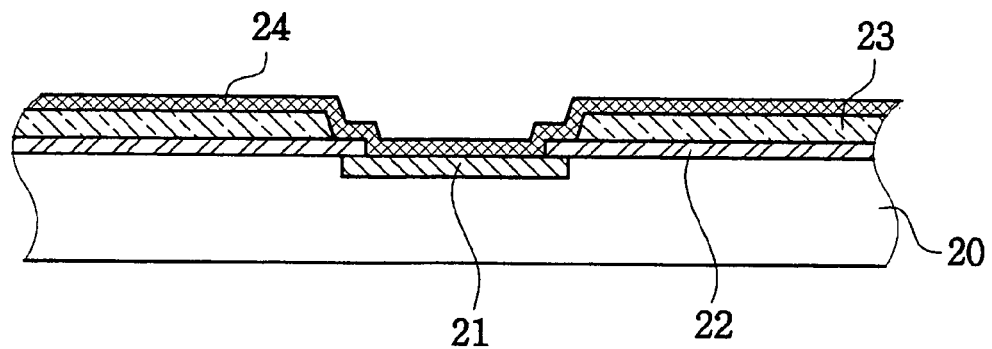

Referring to FIG. 3B, a pad metal layer 24 may be deposited over all exposed surfaces on the wafer. The pad metal layer 24 may be formed of aluminum, copper, or another suitable conductive material. The pad metal layer 24 may be deposited using a physical vapor deposition (PVD) process, such as sputtering. The thickness of the pad metal layer 24 may be about 8000 Å.

Figure 3C:
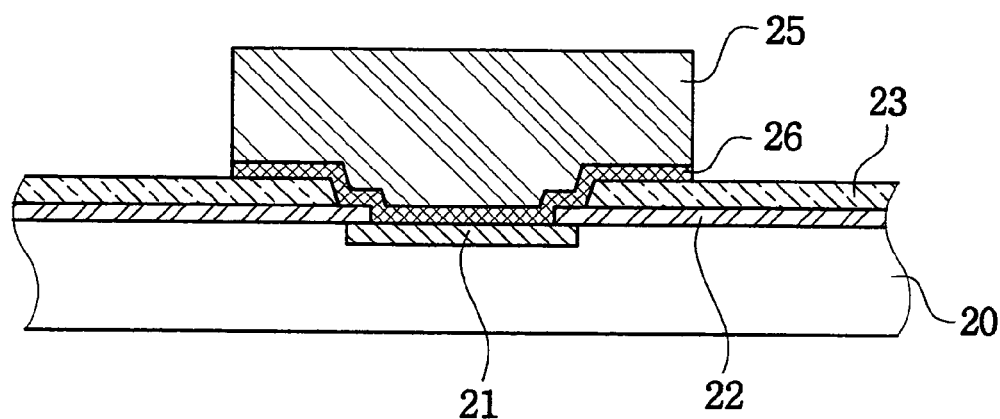

Referring to FIG. 3C, a photoresist pattern 25 is provided on the pad metal layer 24 around the tungsten pad 21. As is well known, a photoresist material that is coated, selectively exposed, and developed may be used to form the photoresist pattern 25. The pad metal layer 24 is selectively etched using the photoresist pattern 25 as an etch mask. The pad metal layer remains only under the photoresist pattern 25, thus forming the I/O pad 26.

Figure 3D:
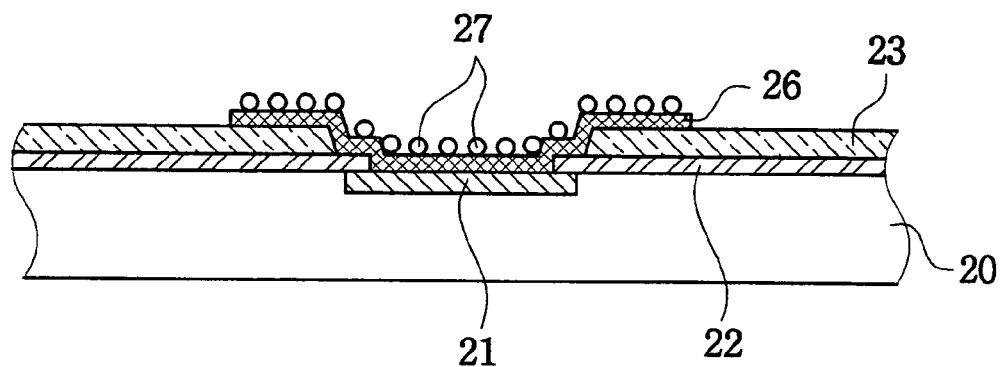

Referring to FIG. 3D, the photoresist pattern 25 is completely removed, and thereby the I/O pad 26 is exposed to the outside. Next, zinc particles 27 are formed on the I/O pad 26 using a zincating technique that employs a zincate solution. Since zincating techniques are well known in the art, a detailed description of the same is omitted. Although the size of the zinc particles 27 are exaggerated for clarity, in reality the size of the zinc particles 27 may be negligible. The zinc particles 27 may act as a plating core that may promote combination of the I/O pad 26 and plating material during a subsequent electroless plating process.

Figure 3E:
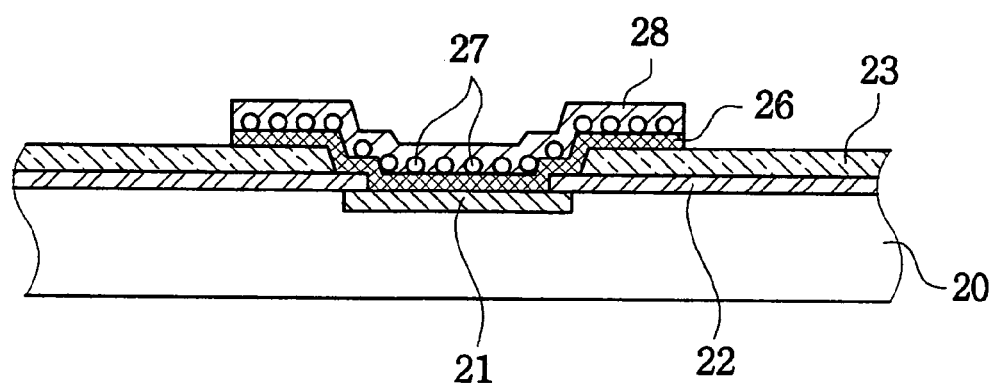

Referring to FIG. 3E, after the zinc particles 27 are formed, the electroless plating layer 28 is deposited on the I/O pad 26 through chemical reduction by an electroless plating process. The electroless plating layer 28 may be formed of nickel, phosphorus-added nickel, or boron-added nickel. After deposition of the nickel layer 28, a gold layer may be deposited thereon to prevent oxidation. The electroless nickel layer 28 may have a thickness of several microns (μm), and the gold layer may have a thickness of about 0.1 μm.

In alternative embodiments, the I/O pad 26 may be formed between the passivation layer 22 and the polymer layer 23.

Figure 4:
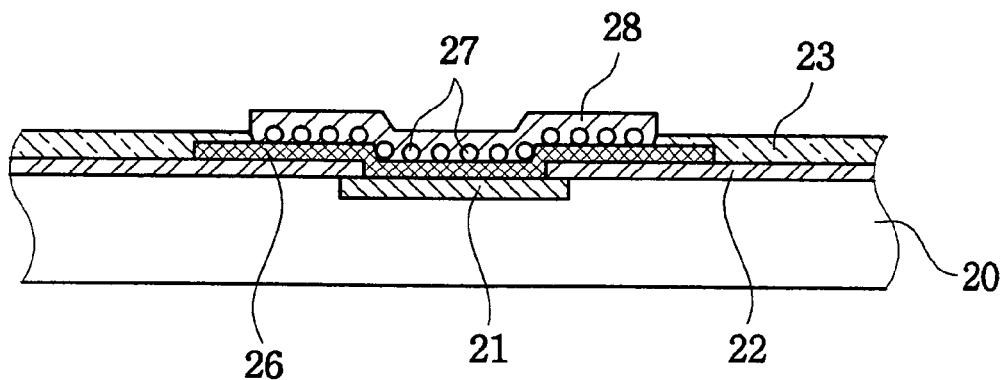
FIG. 4 is a sectional diagram illustrating an interconnection structure of an IC chip in accordance with some other embodiments of the invention.

FIG. 4 is a sectional diagram illustrating an interconnection structure of an IC chip in accordance with some other embodiments of the invention.

Referring to FIG. 4, the I/O pad 26 is formed just after the passivation layer 22 is formed on the top surface of the IC chip 20. The I/O pad 26 has a central portion in contact with the tungsten pad 21, and a peripheral portion in contact with the passivation layer 22 around the tungsten pad 21. The I/O pad 26 may be formed through the same processes as those described above for FIGS. 3A-3E.

The polymer layer 23 is coated on the whole wafer including the I/O pad 26, and then a portion of the polymer layer 23 is removed to expose the I/O pad 26. An exposed area of the I/O pad 26 is greater than the area of the I/O pad that is contact with the tungsten pad 21. The zinc particles 27 are formed on the I/O pad 26, and then the electroless plating layer 28 is deposited thereon.

In the embodiments described above, the solder bump 29 is disposed at approximately the same location, that is, above the tungsten pad 21. In alternative embodiments, the solder bump 29 may be disposed at other locations that are separated from the tungsten pad 21.

Figure 5:
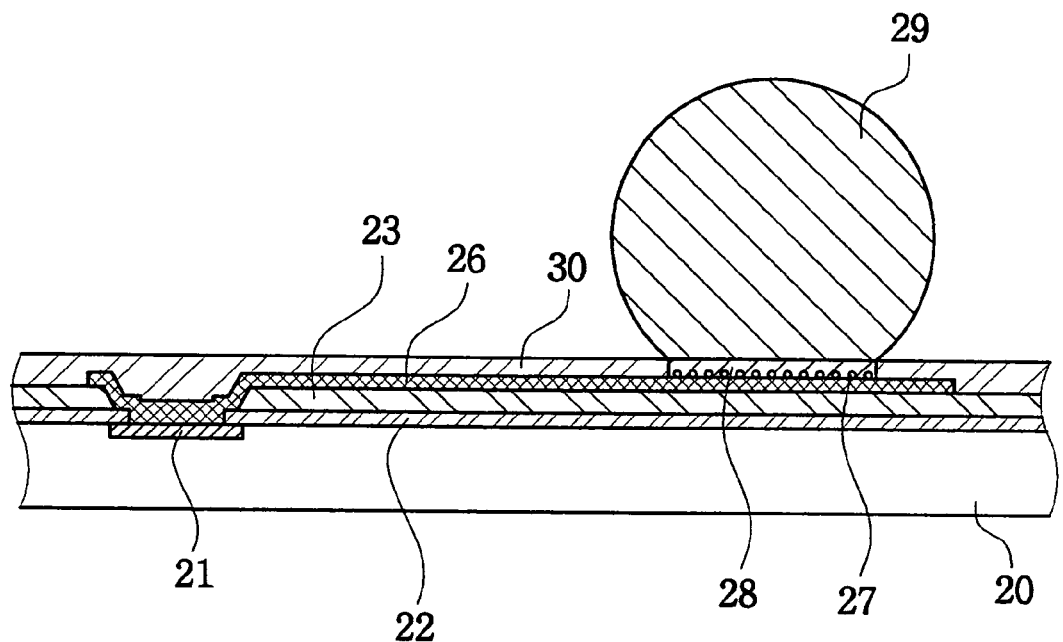
FIG. 5 is a sectional diagram illustrating an interconnection structure of an IC chip in accordance with more embodiments of the invention.

FIG. 5 is a sectional diagram illustrating an interconnection structure of an IC chip in accordance with more embodiments of the invention.

Referring to FIG. 5, the I/O pad 26 not only acts as a normal pad on which the solder bump 29 is mounted, but also functions as a typical redistribution or rerouting line. A first portion of the I/O pad 26 is placed on the tungsten pad 21, and a second portion of the I/O pad 26 is extended along the top surface of the polymer layer 23 to the solder bump 29. Altering the photoresist pattern 25 shown in FIG. 3C may form this structure of the I/O pad 26 used as a redistribution line.

Such a structure may further include an upper additional polymer layer 30. Alternatively, the I/O pad 26 used as a redistribution line may be disposed between the passivation layer 22 and the polymer layer 23.

According to embodiments of the invention, the I/O pad 26 may also act as a test pad.

Figure 6:
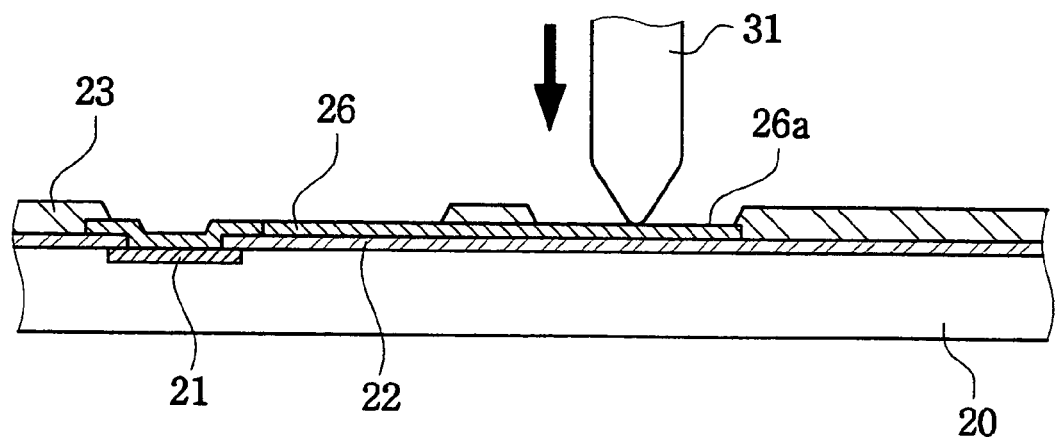
FIG. 6 is a sectional diagram illustrating an interconnection structure of an IC chip in accordance with different embodiments of the invention.

FIG. 6 is a sectional diagram illustrating an interconnection structure of an IC chip in accordance with different embodiments of the invention.

Referring to FIG. 6, one portion of the I/O pad 26 is extended along the top surface of the passivation layer 22. After the wafer fabrication process, the IC chip 20 may undergo an electrical die sorting (EDS) test. In the EDS test, a test probe 31 is typically contacted with the I/O pad 26 so as to implement electrical tests. However, this may cause damage to the I/O pad 26. A separate pad 26a for the EDS test, as shown in FIG. 6, prevents damage to the I/O pad 26. Although not illustrated in FIG. 6, the test pad 26a may be removed or covered before the electroless plating process.

As discussed above, in the interconnection structure according to exemplary embodiments, the I/O pad is expanded to the size required in the package level beyond the size limitations that exist at the chip level. Accordingly, the contact area between the I/O pad and the electroless plating layer is increased, and thereby metallic joints between both metal layers is strengthened. As a result, it is possible to prevent defects, such as cracks or delaminations of the metallic joints, and to improve the yield and reliability of the IC chip and the package.

The invention may be practiced in many ways. What follows are exemplary, non-limiting descriptions of exemplary embodiments of the invention.

According to some embodiments, the interconnection structure includes an IC chip with internal circuitry having terminals for electrical connections. The interconnection structure also includes a passivation layer disposed on a top surface of the IC chip that protects the internal circuitry and exposes the terminals. The structure further includes I/O pads having a first portion and a second portion, the first portion in contact with each terminal, and the second portion extended over the passivation layer. The structure further includes an electroless plating layer formed on the respective I/O pads.

According to some embodiments, the I/O pad may be formed of aluminum or copper.

According to other embodiments of the invention, the structure may further include a polymer layer that is disposed on the passivation layer. The polymer layer may be disposed under the second portions of the respective I/O pads, or on peripheral edges of the second portions of the respective I/O pads.

According to other embodiments of the invention, the structure may further include metal bumps that are disposed on the electroless plating layer. The metal bumps may be disposed at the same locations as the terminals, or at different locations.

According to other embodiments of the invention, the electroless plating layer may be formed of nickel. The electroless nickel plating layer may contain phosphorus or boron. In addition, the electroless nickel plating layer may be coated with a gold layer.

According to other embodiments of the invention, the electroless plating layer may contain zinc particles provided on the respective I/O pads. Additionally, the terminals may be formed of tungsten.

While the inventive aspects have been particularly shown and described with reference to several exemplary embodiments, it will be understood by those skilled in the art that various changes in form and details may be made to these exemplary embodiments without departing from the spirit and scope of the invention as defined by the appended claims.

The invention claimed is:

1. An interconnection structure comprising:
    an integrated circuit (IC) chip having internal circuitry and a terminal to electrically connect the internal circuitry to an external circuit;
    a passivation layer disposed on a top surface of the IC chip, the passivation layer configured to protect the internal circuitry and to expose the terminal;
    an input/output (I/O) pad, the I/O pad including a first portion in contact with the terminal and a second portion that extends over the passivation layer; and
    an electroless plating layer disposed on the I/O pad, the electroless plating layer comprising nickel and plating core particles formed over an opening and over a portion of the passivation layer.

2. The structure of claim 1, the I/O pad comprising at least one selected from the group consisting of aluminum and copper.

3. The structure of claim 1, further comprising a polymer layer disposed on the passivation layer.

4. The structure of claim 3, the polymer layer disposed under the second portion of the I/O pad.

5. The structure of claim 3, the polymer layer disposed on a peripheral edge of the second portion of the I/O pad.

6. The structure of claim 1, further comprising a metal bump disposed on the electroless plating layer.

7. The structure of claim 6, the metal bump substantially aligned with the terminal in a vertical direction.

8. The structure of claim 6, the metal bump not aligned with the terminal in a vertical direction.

9. The structure of claim 1, the electroless plating layer further comprising phosphorus or boron.

10. The structure of claim 1, further comprising a gold layer coating the electroless plating layer.

11. The structure of claim 1, the electroless plating layer comprising zinc particles.

12. The structure of claim 1, the terminal comprising tungsten.

13. An interconnection structure comprising:
an integrated circuit (IC) chip having a terminal that is electrically connected to an internal circuit of the IC chip, the terminal including tungsten;
a passivation layer disposed on a top surface of the IC chip, the passivation layer having an opening that exposes the terminal;
a polymer layer disposed on a top surface of the passivation layer, the polymer layer having an opening that exposes the terminal and a portion of the passivation layer;
an input/output (I/O) pad including aluminum, the I/O pad disposed over the polymer layer such that the I/O pad directly contacts the exposed portion of the terminal, directly contacts the exposed portion of the passivation layer, and directly contacts a portion of polymer layer; and
an electroless plating layer disposed on the I/O pad, the electroless plating layer including nickel and including zinc particles formed over the opening and over a portion of the polymer layer.

14. The structure of claim 13, further comprising a metal bump disposed on the electroless plating layer.

15. The structure of claim 14, the metal bump disposed to overlap the terminal.

16. The structure of claim 14, the metal bump disposed to not overlap the terminal.

17. An interconnection structure comprising:
an integrated circuit (IC) chip having a terminal that is electrically connected to an internal circuit of the IC chip;
a passivation layer disposed on a top surface of the IC chip, the passivation layer having an opening that exposes the terminal;
an input/output (I/O) pad, the I/O pad disposed in the opening and on the passivation layer; and
an electroless plating layer disposed on the I/O pad, the electroless plating layer including plating core particles formed over the opening and over a portion of the passivation layer.

18. The structure of claim 17, wherein the I/O pad includes a first portion disposed in the opening to be in contact with the terminal and a second portion that extends over the passivation layer, wherein a section of the second portion of the I/O pad is configured as a test pad that is separated from the terminal and used during an electrical die sorting test to prevent damage to the first portion of the I/O pad.

19. The structure of claim 17, wherein the I/O pad is formed of a first material and the electroless plating layer is formed of a second material, the first material being different from the second material.

* * * * *

UNITED STATES PATENT AND TRADEMARK OFFICE
CERTIFICATE OF CORRECTION

| | | |
|---|---|---|
| PATENT NO. | : 7,307,342 B2 | Page 1 of 1 |
| APPLICATION NO. | : 11/195361 | |
| DATED | : December 11, 2007 | |
| INVENTOR(S) | : Se-Young Jeong et al. | |

It is certified that error appears in the above-identified patent and that said Letters Patent is hereby corrected as shown below:

Column 3, line 13, the word "my" should read -- may --.

Signed and Sealed this

Twelfth Day of August, 2008

JON W. DUDAS
*Director of the United States Patent and Trademark Office*